US006759599B2

(12) United States Patent
Tatoh et al.

(10) Patent No.: US 6,759,599 B2
(45) Date of Patent: Jul. 6, 2004

(54) CIRCUIT BOARD, METHOD FOR MANUFACTURING SAME, AND HIGH-OUTPUT MODULE

(75) Inventors: Nobuyoshi Tatoh, Itami (JP); Jun Yorita, Hyogo (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/187,379

(22) Filed: Jul. 2, 2002

(65) Prior Publication Data

US 2003/0005582 A1 Jan. 9, 2003

(30) Foreign Application Priority Data

Jul. 5, 2001 (JP) ........................................ 2001-204457

(51) Int. Cl.[7] .............................. H05K 1/11; H05K 1/03
(52) U.S. Cl. ...................... 174/261; 174/255; 174/257; 257/775; 257/781; 257/763; 438/614; 438/652
(58) Field of Search .................................. 174/261, 256, 174/257, 267, 255; 257/770, 775, 778, 781, 737, 741, 763, 762, 766, 750; 438/613, 614, 652, 653, 656, 666, 669

(56) References Cited

U.S. PATENT DOCUMENTS 3,881,884 A * 5/1975 Cook et al. .................. 216/13
4,075,416 A * 2/1978 Kuttner et al. ............... 174/257
4,626,479 A * 12/1986 Hosoi et al. ................. 428/663
6,111,204 A * 8/2000 Goenka ....................... 174/257
6,334,942 B1 * 1/2002 Haba et al. .................. 205/122
6,342,730 B1 * 1/2002 Jung et al. ................... 257/692
6,486,551 B1 * 11/2002 Sato et al. ................... 257/737
6,498,097 B1 * 12/2002 Park et al. ................... 438/686

FOREIGN PATENT DOCUMENTS

JP          2-271585         11/1990

* cited by examiner

Primary Examiner—Carl Whitehead, Jr.
Assistant Examiner—J B Patel
(74) Attorney, Agent, or Firm—McDermott, Will & Emery

(57) ABSTRACT

A circuit board comprising a first metal layer formed in patterns on a ceramic substrate, a second metal layer formed in patterns on the first metal layer, and a third metal layer formed covering the top surface of the second metal layer and the majority of the side surface, wherein the first and partial second metal layers not covered by the third metal layer are reduced in width by etching. The circuit board has a fine and high-resolution wiring pattern and makes it possible to realize a miniature high-performance high-output module by mounting at least one high-output semiconductor element thereon.

9 Claims, 4 Drawing Sheets

CIRCUIT BOARD, METHOD FOR MANUFACTURING SAME, AND HIGH-OUTPUT MODULE

BACKGROUND OF THE INVENTION

1. Field of the Invention

The present invention relates to a ceramic circuit board for a semiconductor device, and to a method for manufacturing this circuit board, and to a high-output module.

Semiconductor elements include LD (laser diode or semiconductor laser), APD (avalanche photodiode), and other such optical semiconductor elements; HEMT (high electron mobility transistor), HBT (hetero-bipolar transistor), and other such semiconductor elements using GaAs, InP, Si/SiGe, or the like that can operate at high speed; IGBT (insulated gate bipolar transistor) and other such inverter/power converter silicon devices; and BiTe and other such thermoelectric semiconductor elements, and the circuit boards used in these fields need to have low electrical resistance, good thermal radiation, well-matched thermal expansion, and a super-fine wiring pattern for higher integration and speed.

2. Description of the Prior Art

A conventional circuit board will be described through reference to FIGS. 4A–4F. As shown in FIGS. 4A–4E the process has been as follows up to now. A metal mask or photomask 2 is applied on a ceramic substrate 1 (FIG. 4A), a first metal layer 3 is formed by vapor deposition or sputtering, and the metal mask or photomask 2 is removed (FIG. 4B), after which a resist 4 is formed (FIG. 4C), and then a second metal layer 5 is formed by vapor deposition or sputtering (FIG. 4D), and the resist is removed to obtain a completed product (FIG. 4E).

The ceramic substrate 1 is made from AlN or alumina. This is disclosed, for instance, in Japanese Patent Publication 2-271585. The first metal layer is used for a resistor, and TaN, NiCr, or tungsten is generally used therein. The second metal layer is used for a wiring or an inductance, and has a laminate structure comprising Ti/Mo/Au, Ti/Pt/Au, Cr/Mo/Au, or Ti/V/Au. The reason for using titanium or chromium for the layer in contact with the ceramic substrate is to increase the adhesion strength to the substrate. Because the platinum, molybdenum, or vanadium in the middle has a high melting point, it is inserted in order to prevent the top layer from alloying with the metal, i.e., titanium or chromium used in the above contact portion. Gold is used for the top layer, and is selected in order to successfully perform wire bonding or die bonding. An example of the combination of materials in the completed product is shown in FIG. 4F.

With a substrate for a power semiconductor, copper or gold is applied to the entire top surface of a ceramic substrate by vapor deposition, plating, or fusion, after which a wiring pattern is formed by etching.

To produce a high-output module, semiconductor elements are mounted on these circuit boards by means of die bonding.

With today's high-output modules, in addition to making the modules smaller merely to reduce the size of the final device, there is also the need to make the wiring patterns much finer with a reduced size so that higher frequencies can be handled. It is also necessary to lower the resistance of the metal portion of the wiring in order to reduce loss of high frequency characteristics and decrease power consumption, and to this end thick-film techniques have become necessary to increase the thickness of the wiring patterns.

To satisfy both of these requirements at the same time, it was necessary for the thickness of the metal layer used for wiring to be at least 5 $\mu$m, and for the aspect ratio (D/L) between the wiring thickness D ($\mu$m) and the distance L ($\mu$m) between the adjacent wiring pattern lines to be D/L>0.4, but a conventional circuit board could not be processed so that both of these could be satisfied.

The reason for this is that a fine pattern could not be formed on a substrate, onto which a thick film resist has been applied, with a vapor deposition process relying on a metal mask or photomask, which is a conventionally practiced fine wiring process, and that vapor deposition had to be continued for a long time in order to obtain a thick film, so practical application was difficult. Also, when a wiring pattern was formed by etching, it was difficult to perform fine processing of a pattern smaller than the wiring thickness because side etching occurred, and etching removal was particularly difficult. Consequently, a miniaturized high-performance high-output module could not be realized.

SUMMARY OF THE INVENTION

It is an object of the present invention to provide a circuit board having thick-film fine wiring patterns, and to realize a miniature high-performance high-output module.

In order to solve the above problems, the present invention is constituted as follows.

(1) A circuit board comprising a first metal layer formed in patterns on a ceramic substrate, a second metal layer formed in patterns on the first metal layer, and a third metal layer formed covering the entire top surface of the second metal layer and the majority of the side surfaces of the same, wherein the first metal layer and the partial second metal layer not covered by the third metal layer are reduced in width by etching.

(2) The circuit board according to (1) above, wherein the combined thickness D ($\mu$m) of the first, second, and third metal layers and the distance L ($\mu$m) between adjacent pattern lines satisfy the relationship of the following formula.

$$D/L>0.4$$

(3) The circuit board according to (1) or (2) above, wherein the combined thickness D $\mu$m of the first, second, and third metal layers is at least 5 $\mu$m.

(4) The circuit board according to any of (1) to (3) above, wherein the second metal layer includes at least one selected from the group consisting of copper, nickel, silver, and aluminum.

(5) The circuit board according to any of (1) to (4) above, wherein the outermost layer of the third metal layer is gold.

(6) The circuit board according to any of (1) to (5) above, wherein the ceramic substrate contains at least one selected from the group consisting of alumina, AlN, and $Si_3N_4$ in an amount of at least 90 wt %.

(7) The circuit board according to any of (1) to (5) above, wherein the ceramic substrate is diamond or cBN.

(8) A method for manufacturing a circuit board comprising:

vapor depositing or sputtering a first metal layer on a ceramic substrate;

forming a resist in patterns;

applying a second metal layer on the first metal layer by plating using the resist as a mask;

making the resist into a thin layer;

applying a third metal layer on the top surface of the second metal layer and the majority of the side surfaces of the second metal layer by plating; and removing the resist and then etching the first metal layer so that the first and partial second metal layers not covered by the third metal layer are reduced in width by etching.

(9) A high-output module, wherein at least one high-output semiconductor element that generates a heat of at least 10 mW is joined on the circuit board according to any of (1) to (7) above via solder or an electrically conductive resin.

DETAILED DESCRIPTION OF THE PREFERRED EMBODIMENTS

The circuit board of the present invention is manufactured as follows. First, onto a ceramic substrate a first metal layer with good adhesion to the substrate, such as Ti/Mo/Ni, is applied by vapor deposition or sputtering. A photoresist pattern is formed on this first metal layer using a photomask. In this state the entire surface of the substrate can serve as an electrode, so a second metal layer thick film can be selectively formed by electroplating in the places where there is no photoresist. The resist is then made into a thin layer. A third metal layer, such as gold, Ni/Au, or a layer having a multilayer structure in which an interlayer (a layer for preventing the diffusion of gold), for example, of palladium, platinum, molybdenum, tungsten or vanadium is inserted between nickel and gold layers, such as an Ni/Pt/Au layer, is grown on the second metal layer by electroplating. Making the resist into a thin layer as above allows the electroplating to cover the entire top surface of the second metal layer and the sides where the resist has been removed. After this the resist is completely removed.

The first metal layer not covered by the third metal layer is then removed by etching. If the outermost layer of the third metal layer is one that will not be etched by the etching solution used on the first metal layer, then the portion covered by the third metal layer will not be etched, which allows for selective etching. For instance, if the outermost layer of the third metal layer is gold and the first metal layer is constituted by Ti/Mo/Ni, the gold will not be etched by the etching solution for nickel and molybdenum, so the gold can be used as a mask in this etching. Titanium will only dissolve in a separate hydrofluoric acid-based etching solution, but since the gold will not be etched even by this etching solution, it can function as a mask for selective etching.

Figure 1:
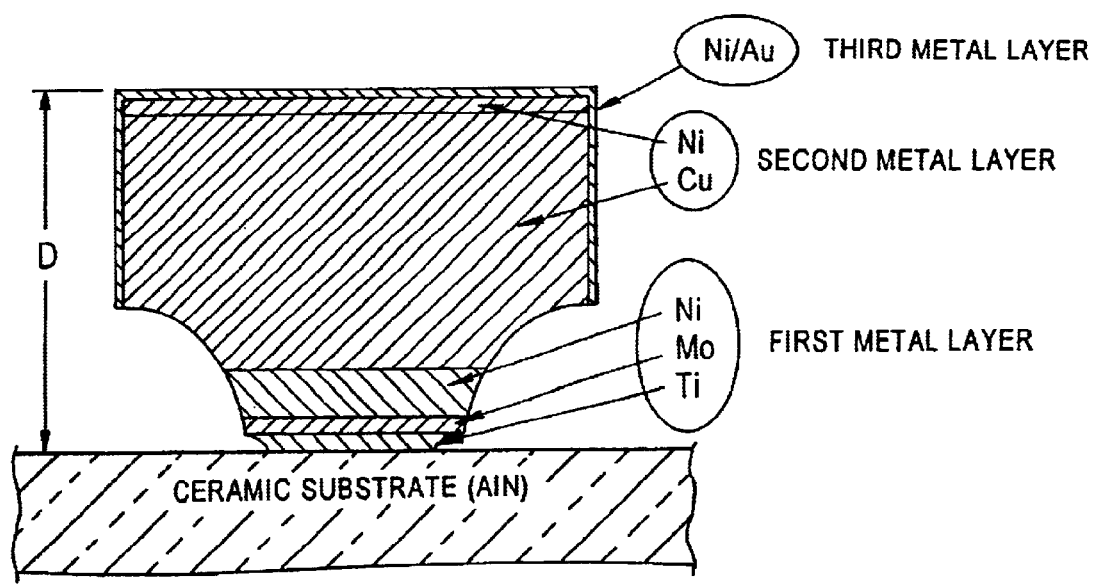
FIG. 1 is a cross section illustrating an example of the wiring in the circuit board of the present invention.

FIG. 1 illustrates an example of the layer structure of the metal layers in the circuit board obtained in this manner. The sides not covered with the gold of the third metal layer have been smoothly scooped out by side etching, and the scooping out of the titanium is even greater.

It is also possible to apply a chromium-based (such as NiCr) metallization pattern as a lowermost metal layer at the outset for positioning a photomask or as a resistor. This lowermost metal layer will not be etched by any etching solution, and will therefore remain until the end. It also has good adhesion with ceramics.

With the present invention, the second metal layer can be formed by electroplating, so the metal layer can be easily made into a thick film, and, as mentioned above, if the second metal layer is partially covered with a third metal layer having an outermost layer that will not be etched by the etching solution used for the first metal layer, then a wiring pattern can be formed by etching.

The first metal layer has a multilayer structure composed, for example, of Ti/Mo/Ni, Ti/Pt/Ni, Ti/V/Ni, or Ti/Pd/Ni. The thickness of the first metal layer is preferably 0.12 to 1.2 $\mu$m. If this layer is too thin, it will be difficult to achieve uniform metallization on the entire top surface of the substrate, but if it is too thick, there will be so much side etching that fine working will be difficult. When the first metal layer is composed of Ti/Mo/Ni, the thickness of the titanium should be 0.01 to 0.3 $\mu$m, the thickness of the molybdenum should be 0.01 to 0.3 $\mu$m, and the thickness of the nickel should be 0.1 to 0.6 $\mu$m.

The thickness of the resist formed on the first metal layer should be at least 5 $\mu$m in order for the combined thickness of the first, second, and third metal layers to be at least 5 $\mu$m. If the resist is too thin, the second metal layer will cover the top of the resist, resulting in an undesirable mushroom shape. Furthermore, adjacent lines of the second metal layer will connect to each other on the resist. Although it was difficult to increase the thickness of the resist, the thickness could be increased by optimizing the exposure conditions, which made it possible to form a fine wiring pattern with straight upright sides. An SOR (synchrotron orbital radiation) light was used for the exposure. Forming this thick film resist minimizes the mushroom shape mentioned above.

The pattern precision of the photoresist used for electroplating is from the submicron level up to 10 nm. The tiny spacing portions between photoresist lines can be plated by using a surfactant. Making the resist into a thin layer can be accomplished by ashing or the like.

With the circuit board of the present invention, the second metal layer preferably contains at least one of metal selected from among copper, nickel, silver, and aluminum. Forming a thick film of at least 5 $\mu$m by electroplating is possible. Even 200 $\mu$m is possible, for instance. Keeping the thickness of the second metal layer to at least 5 $\mu$m lowers the resistance of the wiring, and is suitable, for example, for thermoelectric semiconductor elements that require a thick wiring in order to lessen thermal stress, such as a Peltier element. Examples of the second metal layer include copper, Cu/Ni, Ni/Cu/Ni, aluminum, Ni/Al/Ni, Al/Ni, and silver. Copper alone is fine if an alloying treatment is subsequently performed to raise the adhesive strength, but the adhesion to gold or Ni/Au will be better if nickel is applied in a thickness of at least 0.5 $\mu$m to the top of the copper.

It is best for as much of the side surface of the second metal layer as possible to be covered with the third metal layer. It is preferable for at least 80% of the side surface of the second metal layer to be covered with the third metal layer. Covering at least 80% of the side surface of the second metal layer results in very little side etching which may be caused during etching the first metal layer. If all of the second metal layer is covered, it will be necessary to reduce the thickness of the resist used in forming the second metal layer. It is difficult, however, to uniformly reduce the thickness of the resist down to the level of the first metal layer. Therefore, in the formation of the third metal layer, the resist used for forming the second metal layer serves as a partial mask, so the entire second metal layer is not completely covered with the third metal layer.

Examples of the third metal layer include gold, Ni/Au, and a multilayer structure in which an interlayer (a layer for preventing the diffusion of gold) such as palladium, platinum, molybdenum, tungsten or vanadium is inserted between nickel and gold layers, such as Ni/Pt/Au. The outermost layer of the third metal layer can be any metal that will not be etched by the etching solution used for the first metal layer, but using gold for the outermost layer is particularly favorable in terms of being able to carry out subsequent steps favorably.

With the circuit board of the present invention, the second metal layer can be formed by electroplating, so the metal layer can be a thick film and a fine wiring pattern with straight upright sides can be formed by using a resist, and therefore working can be performed so that the aspect ratio (D/L) between the wiring thickness D in terms of $\mu$m and the distance L in terms of $\mu$m between wiring pattern lines will be D/L>0.4. In the present invention, the wiring thickness D is the combined thickness of the first, second, and third metal layers, and the line spacing L expresses the distance between lines of the second metal layer patterns covered by the third metal layer.

Alumina may be used for the ceramic substrate, but since thermal radiation is important with a high-output module, it is preferable to use diamond or cBN, or a ceramic comprising AlN and/or $Si_3N_4$ in a content of at least 90 wt %. AlN provides a low cost and high leak-resistance substrate. When strength is required, the use of $Si_3N_4$ is preferred. A mixture of AlN and $Si_3N_4$ may also be used. Also, if the substrate surface is too rough, disconnection may occur due to the thickness of the laminated first metal layer, so surface-treating may be performed.

The present invention is also a high-output module comprising at least one high-output semiconductor element that generates a heat of at least 10 mW, joined on the circuit board obtained above via solder or an electrically conductive resin.

Examples of the present invention will now be described through reference to the drawings.

EXAMPLE 1

Figure 2:
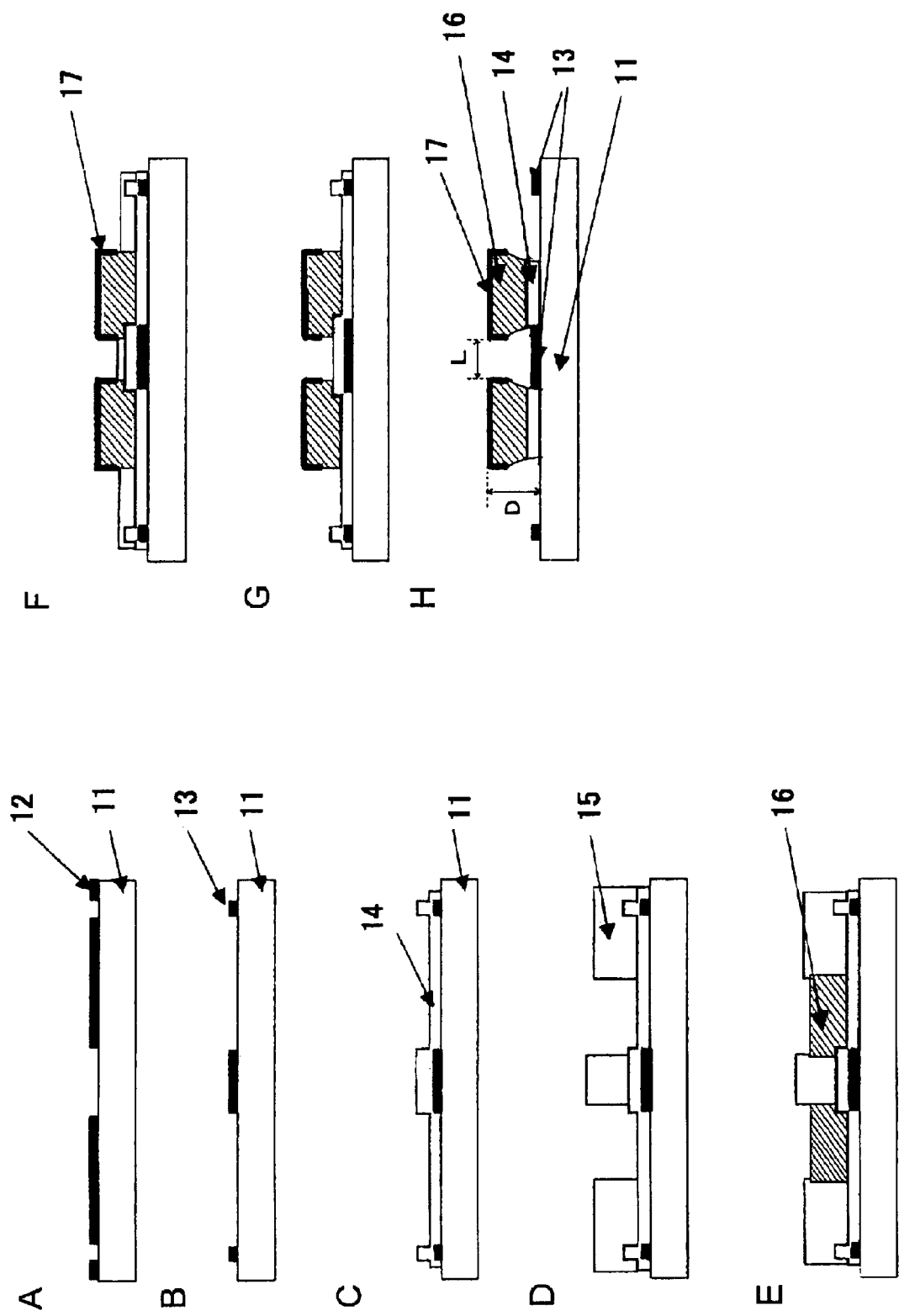
FIGS. 2A–2H are diagrams illustrating the steps for manufacturing a circuit board in an example of the present invention.

In FIG. 2A, a high-thermal radiation ceramic substrate with an AlN content of at least 90 wt %, containing yttrium, and having a thermal conductivity of 170 W/(m·K) was used as a ceramic substrate 11. The surface of the ceramic substrate was surface-treated to a surface roughness Ra of less than 0.8 $\mu$m. This is because the subsequently laminated first metal layer was 0.5 $\mu$m or less in thickness, so disconnection could occur if the surface were too rough.

A metal mask 12 was applied to the ceramic substrate 11, and an NiCr metal layer 13 was formed as a lowermost metal layer. A sputtering apparatus was used for this purpose. Although this layer may be used as a resistor or as a positioning mark during subsequent dicing of the substrate, and the NiCr layer was selected here for use as a resistor. FIG. 2B illustrates the state when the metal mask 12 has been removed, after which the NiCr pattern as a lowermost metal layer 13 remains on the surface of the ceramic substrate 11.

Next, as shown in FIG. 2C, a multilayer first metal layer 14 of Ti/Mo/Ni was vapor deposited on the entire top surface of the ceramic substrate 11. The thickness of the titanium was 0.05 $\mu$m, the thickness of the molybdenum was 0.05 $\mu$m, and the thickness of the nickel was 0.3 $\mu$m.

On this, a resist 15 was formed using a photomask, as shown in FIG. 2D. The thickness of the resist 15 was 120 $\mu$m in consideration of the thickness of the second metal layer.

Next, as shown in FIG. 2E, a second metal layer 16 composed of Ni/Cu was laminated by electroplating. To improve the adhesion of the plating, the nickel thickness was 0.5 $\mu$m, and the copper thickness was 100 $\mu$m.

As shown in FIG. 2F, the thickness of the resist was reduced to 10 $\mu$m by $O_2$ ashing. This was done because gold plating would be performed up to the copper portion at the side surfaces of the second metal layer. In this state, a third metal layer 17 composed of Ni/Au was plated so as to cover the copper wiring portion. The nickel thickness was 1.3 $\mu$m, and the gold thickness was 1.0 $\mu$m.

The resist was removed as shown in FIG. 2G, after which the nickel and molybdenum were etched as shown in FIG. 2H. Here, a nickel oxide film was formed on the surface during the resist removal, so this film was removed, after which the nickel and molybdenum were etched all at once with a reactive etching solution. The titanium was removed with a hydrofluoric acid-based etching solution.

The combined thickness D ($\mu$m) of the first, second, and third metal layers was 100 $\mu$m, and the distance L ($\mu$m) between pattern lines was 40 $\mu$m. The resistance between wiring lines was at least 1 M$\Omega$, and the resulting circuit board also had excellent insulation.

In this example, the metal wiring patterns were formed on one side of the ceramic substrate, but can also be applied to both sides.

EXAMPLE 2

Figure 3:
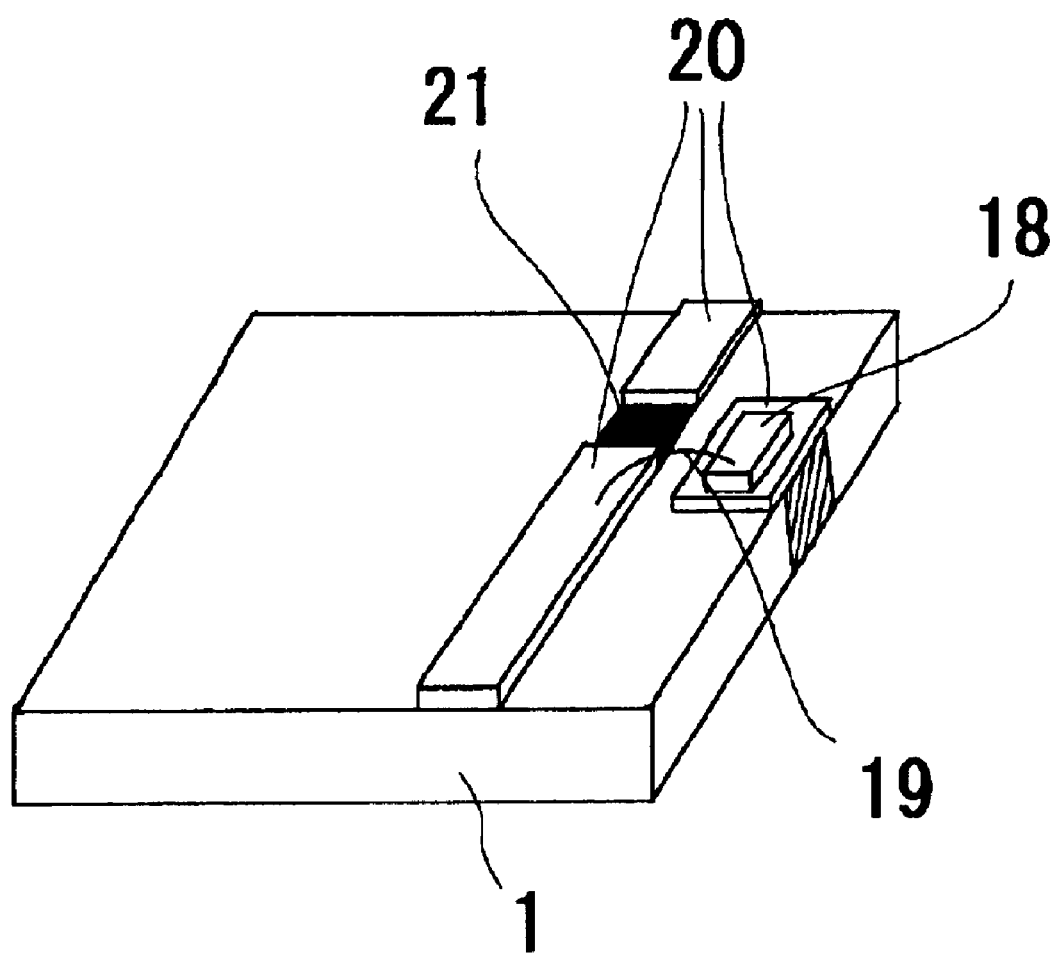
FIG. 3 is a diagram of the structure of the high-output module produced in an example.
Figure 4A:
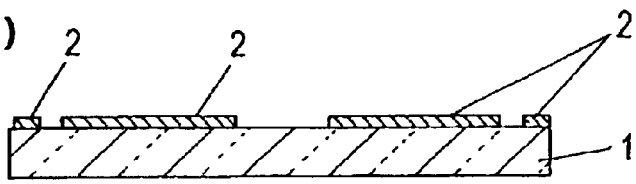
FIGS. 4A–4E are diagrams illustrating the steps for manufacturing a conventional circuit board and FIG. 4F is a diagram showing a combination of materials in the completed circuit board.
Figure 4B:
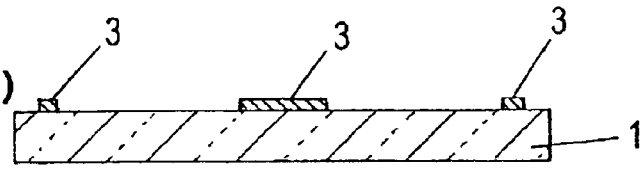
Figure 4C:
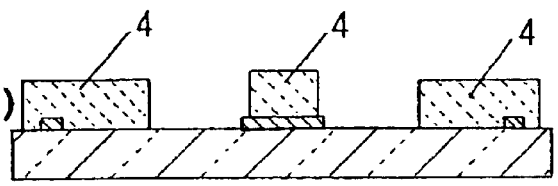
Figure 4D:
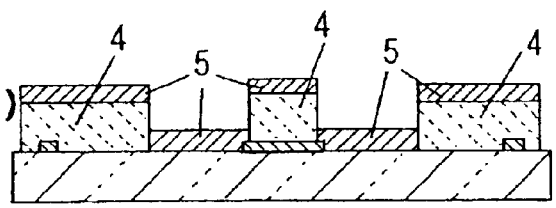
Figure 4E:
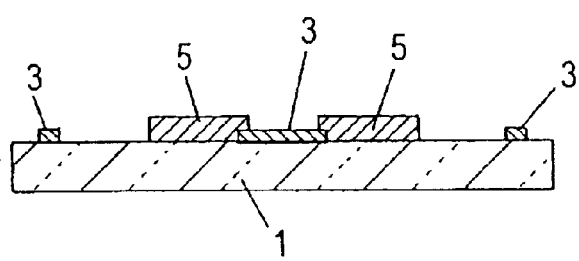
Figure 4F:
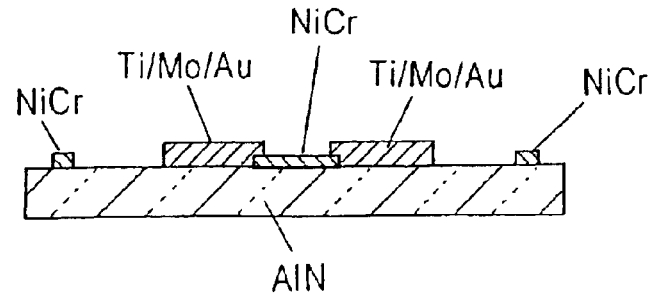

A circuit board having the pattern shown in FIG. 3 was produced using the process described above in Example 1. The wiring layer 20 here was such that the first metal layer was Ti/Mo/Ni and the second metal layer was Ni/Cu, the third metal layer was Ni/Au, and the resistor layer 21 was Ni/Cr. A high-output LD (semiconductor laser) 18 with an integrated modulator and a heat generation of at least 10 mW was mounted to this circuit board by die bonding with solder, and wire bonding was performed using a bonding wire 19 to produce a high-output module shown in FIG. 3. After mounting the LD, the module was operated, whereupon the SN ratio of modulation characteristics was 0.1 dB better than when a conventional circuit board was used. The size of the circuit board for mounting the LD was only one-fourth that of a conventional board, and the speed limit was increased to 40 Gbps or more.

The present invention makes it possible to obtain a miniature high-performance circuit board having thick-film fine wiring patterns. It is therefore possible to obtain a miniature high-performance high-output module.

What is claimed is:

1. A circuit board comprising a first metal layer formed in patterns on a ceramic substrate, a second metal layer formed in patterns on the first metal layer, and a third metal layer formed covering the entire top surface of the second metal layer and the majority of the side surfaces of the second metal layer, wherein the first and part of the second metal layers not covered by the third metal layer are reduced in width by etching.

2. The circuit board according to claim 1, wherein a combined thickness D $\mu$m of the first, second, and third metal layers and a distance L μm between adjacent pattern lines satisfy the relationship of the following formula:

$$D/L > 0.4.$$

3. The circuit board according to claim 1, wherein the combined thickness D μm of the first, second, and third metal layers is at least 5 μm.

4. The circuit board according to claim 1, wherein the second metal layer includes at least one selected from the group consisting of copper, nickel, silver, and aluminum.

5. The circuit board according to claim 1, wherein the outermost layer of the third metal layer is gold.

6. The circuit board according to claim 1, wherein the ceramic substrate contains at least one selected from the group consisting of alumina, AN, and Si3N4 in an amount of at least 90 wt %.

7. The circuit board according to claim 1, wherein the ceramic substrate is diamond or cBN.

8. A high-output module, wherein at least one high-output semiconductor element that generates a heat of at least 10 mW is joined on the circuit board according to claim 1 via a solder or an electrically conductive resin.

9. A method for manufacturing a circuit board comprising:

vapor depositing or sputtering a first metal layer on a ceramic substrate; forming a resist in patterns;

applying a second metal layer on the first metal layer by plating using the resist as a mask;

making the resist into a thin layer;

applying a third metal layer on a top surface of the second metal layer and the majority of side surfaces of the second metal layer by plating; and removing the resist and then etching the first metal layer and part of the second metal layer so that the first and part of the second metal layers not covered by the third metal layer are reduced in width by etching.

* * * * *